(12) United States Patent
McDonald et al.

(10) Patent No.: US 9,065,435 B1
(45) Date of Patent: Jun. 23, 2015

(54) REDUCED PIN FULL FEATURE LOAD SWITCH

(71) Applicant: Silego Technology, Inc., Santa Clara, CA (US)

(72) Inventors: John Othniel McDonald, Mountain House, CA (US); Jie Chen, Saratoga, CA (US); Chen-Yu Wang, San Jose, CA (US)

(73) Assignee: Silego Technology, Inc., Santa Clara, CA (US)

( * ) Notice: Subject to any disclaimer, the term of this patent is extended or adjusted under 35 U.S.C. 154(b) by 0 days.

(21) Appl. No.: 13/922,121

(22) Filed: Jun. 19, 2013

Related U.S. Application Data

(60) Provisional application No. 61/661,749, filed on Jun. 19, 2012, provisional application No. 61/699,749, filed on Sep. 11, 2012.

(51) Int. Cl.
*H03K 5/12* (2006.01)
*H03K 4/00* (2006.01)

(52) U.S. Cl.
CPC ... *H03K 5/12* (2013.01); *H03K 4/00* (2013.01)

(58) Field of Classification Search
CPC .............................. H03K 17/166; H03K 4/00
USPC ......... 327/427, 170, 336, 345, 434, 126, 127, 327/130, 131, 132, 134, 138, 140
See application file for complete search history.

(56) References Cited

U.S. PATENT DOCUMENTS

2012/0019287 A1* 1/2012 Brumett et al. ............... 327/109

* cited by examiner

*Primary Examiner* — Jung Kim
(74) *Attorney, Agent, or Firm* — Van Pelt, Yi & James LLP

(57) ABSTRACT

A four pin integrated circuit MOSFET (Metal-Oxide-Semiconductor Field-Effect Transistor) load switch is disclosed that provides full features including adjustable ramp time/rate, adjustable discharge time/rate, temperature control, over-current control, and short circuit protection. In some embodiments, the adjustable ramp is based on the voltage or current input into the integrated circuit.

30 Claims, 3 Drawing Sheets

REDUCED PIN FULL FEATURE LOAD SWITCH

CROSS REFERENCE TO OTHER APPLICATIONS

This application claims priority to U.S. Provisional Patent Application No. 61/661,749 entitled REDUCED PIN FULL FEATURE FET SWITCH filed Jun. 19, 2012 which is incorporated herein by reference for all purposes and to U.S. Provisional Patent Application No. 61/699,749 entitled REDUCED PIN FULL FEATURE FET SWITCH filed Sep. 11, 2012 which is incorporated herein by reference for all purposes.

BACKGROUND OF THE INVENTION

An integrated circuit comprising a load switch typically requires extra pins for features such as adjustable slew and discharge rates. It would be useful to reduce the pin count of such a device while still providing such features.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims, and the invention encompasses numerous alternatives, modifications, and equivalents. Numerous specific details are set forth in the following description in order to provide a thorough understanding of the invention. These details are provided for the purpose of example, and the invention may be practiced according to the claims without some or all of these specific details. For the purpose of clarity, technical material that is known in the technical fields related to the invention has not been described in detail so that the invention is not unnecessarily obscured.

Figure 1:
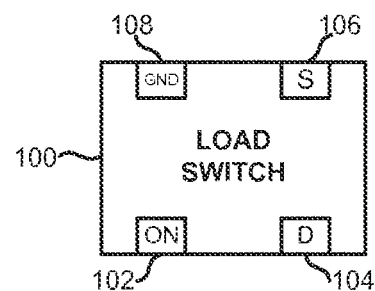
FIG. 1 illustrates an embodiment of an integrated circuit comprising a MOSFET load switch.

FIG. 1 illustrates an embodiment of an integrated circuit comprising a (power) MOSFET (Metal-Oxide-Semiconductor Field-Effect Transistor) load switch. As depicted, integrated circuit 100 comprises a four pin configuration including a control pin 102 for switching the MOSFET, a MOSFET drain pin 104, a MOSFET source pin 106, and a ground pin 108. In some embodiments, the four pin integrated circuit MOSFET load switch described herein is full featured and provides a programmable controlled ramp rate without requiring an additional pin, an adjustable discharge without requiring an additional pin, temperature control, over-current control, and/or short circuit protection. Although the given examples describe a single load switch having a four pin configuration, the disclosed techniques may be similarly extended to and employed for other configurations such as a dual in six pins, a triple in eight pins, a quad in ten pins, etc.

Figure 2A:
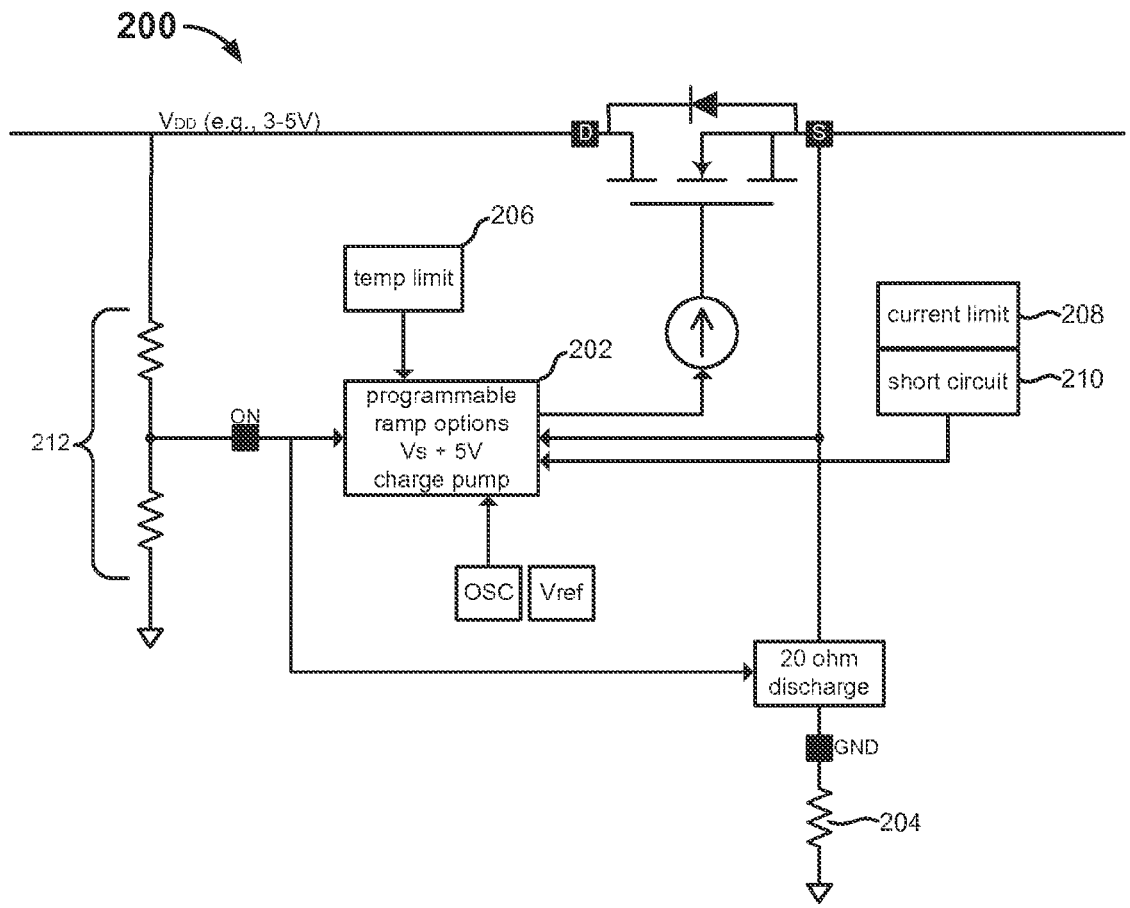
FIG. 2A illustrates a high level block diagram of an embodiment of a load switch.

FIG. 2A illustrates a high level block diagram of an embodiment of a load switch. In some embodiments, load switch 200 comprises integrated circuit 100 of FIG. 1. In some embodiments, load switch 200 comprises an HS (high-side) load switch such as a <5V version of an HS load switch. As depicted, load switch 200 provides circuitry for an adjustable ramp rate 202, adjustable discharge 204, over-temperature protection 206, over-current protection 208, and short circuit protection 210. In the given configuration of load switch 200, an adjustable or programmable linear closed loop ramp is based on the input voltage level on the ON pin, thus eliminating the need for an extra pin for this feature as well as the delay associated with slowing a ramp with an external RC time constant as required by typically employed techniques for controlling ramp rate. Specifically, in the example of FIG. 2A, a linear closed loop ramp is set by an external voltage divider 212. In other embodiments, any other appropriate technique for accomplishing the same may be employed. For instance, instead of a continuous adjust set by a voltage divider such as voltage divider 212, the chip may be configured to adjust ramp rate based on discrete voltage levels. The voltage may be driven from a DAC (digital-to-analog converter) or a PWM (pulse width modulator), or any other technique for generating an input voltage may be employed.

Figure 2B:
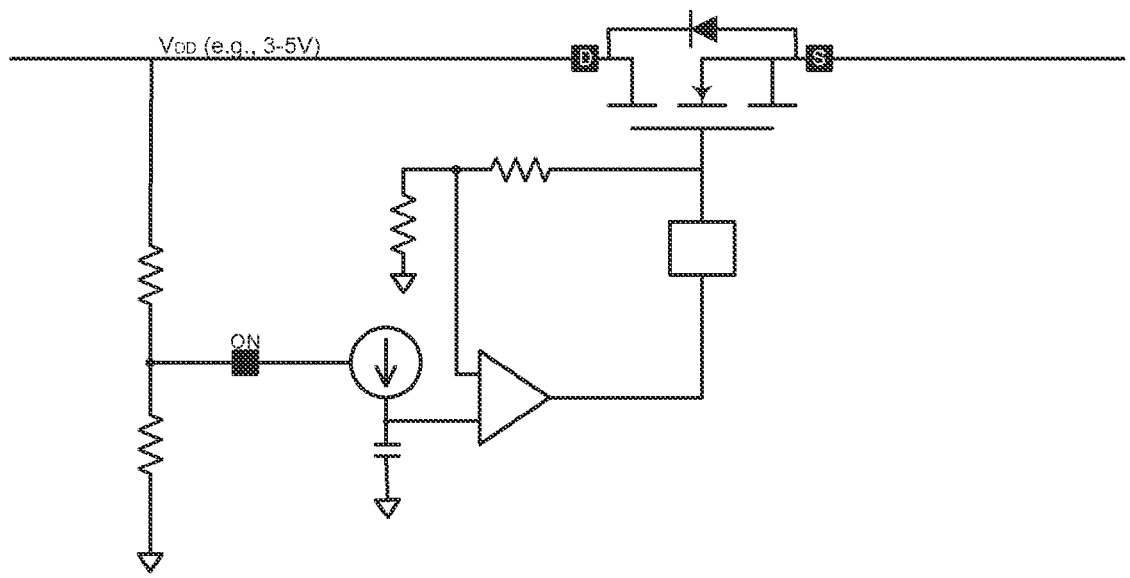
FIG. 2B illustrates an embodiment of high level circuitry of a load switch.

In various embodiments, any appropriate technique for translating input voltage into an adjustable linear closed loop ramp may be employed. FIG. 2B illustrates an embodiment of high level circuitry for achieving an adjustable linear closed loop ramp based on the input voltage level, i.e., on the ON pin. For example, the circuitry of FIG. 2B may at least in part comprise adjustable ramp rate circuitry 202. As depicted, a voltage controlled current source that feeds a capacitor is employed to set the ramp rate. In one example, with an input voltage of 0.5V or lower, the chip MOSFET remains off. This level may be set elsewhere in other embodiments. In this example, with input voltage 1.0V, the ramp rate is 8V/ms; with input voltage 2.0V, the ramp rate is 2V/ms; and with input voltage 3.0V, the ramp rate is 0.5V/ms. Thus, from 0.5V to the lowest possible VDD (i.e., 3V in the given example), the ramp rate function is such that the higher the input voltage on ON, the slower the MOSFET VS ramp. Although in this example lower input voltages represent faster ramps and higher input voltages represent slower ramps, in other embodiments, any desired input voltage to ramp rate function or mapping may be employed.

As further depicted in FIG. 2A, in some embodiments, a discharge resistor is placed directly in-line with the ground pin. Any appropriate discharge resistance may be selected to achieve an adjustable discharge. This configuration does not require any additional pins and thus saves another pin typically required for this feature. Such a configuration has previously been avoided because putting a resistor in series with ground may create a floating ground scenario. However, the associated chip can be designed such that it will remain stable in such a configuration, e.g., even when the external discharge resistor is in the 0-2000 ohms range.

Figure 3A:
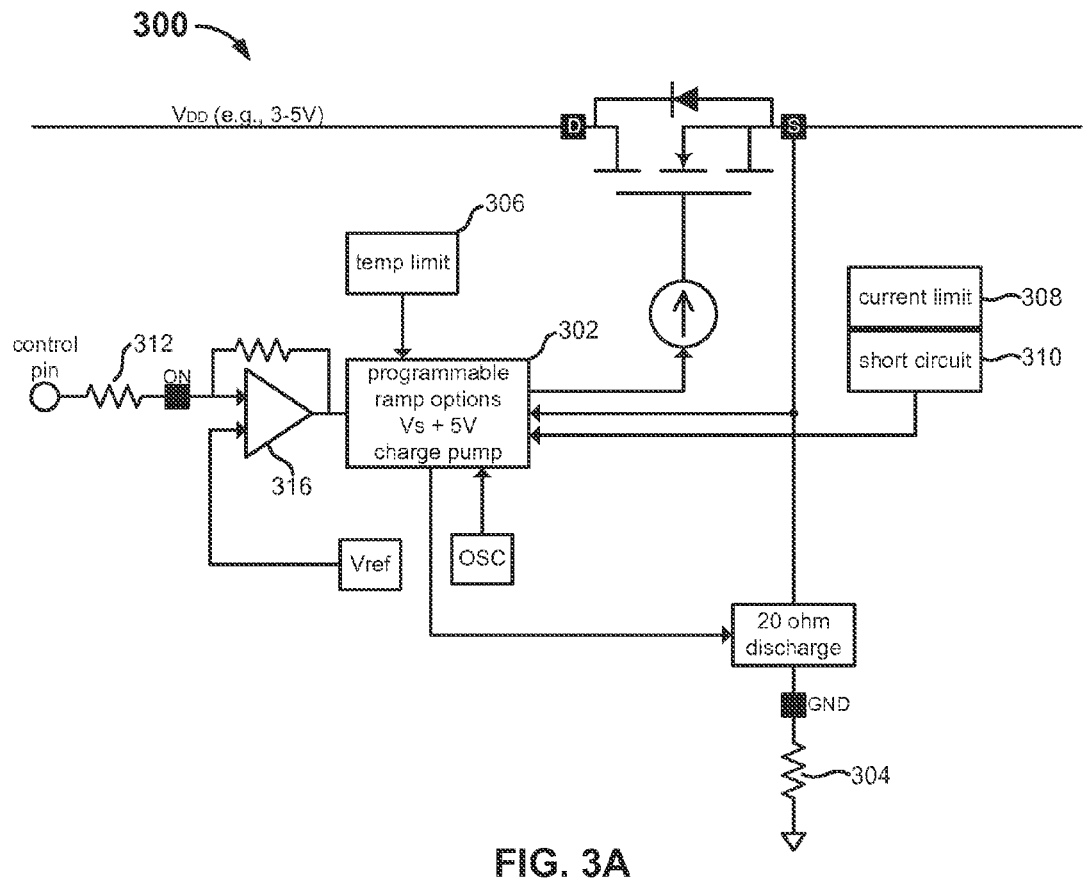
FIG. 3A illustrates a high level block diagram of an embodiment of a load switch.

FIG. 3A illustrates a high level block diagram of an embodiment of a load switch. In some embodiments, load switch 300 comprises integrated circuit 100 of FIG. 1. In some embodiments, load switch 300 comprises an HS (high-side) load switch such as a <5V version of an HS load switch. As depicted, load switch 300 includes circuitry for an adjustable ramp rate 302, adjustable discharge 304, over-temperature protection 306, over-current protection 308, and short circuit protection 310. In the given configuration of load switch 300, an adjustable or programmable linear closed loop ramp is based on the current going into the ON pin. Specifically, in the example of FIG. 3A, a linear closed loop ramp is set by a single external resistor 312 that sets up a current flowing into the device. The input node is held at a constant reference voltage, and the control pin is controlled by the user. The voltage drop across resistor 312 sets up a current which is proportional to ramp time.

Figure 3B:
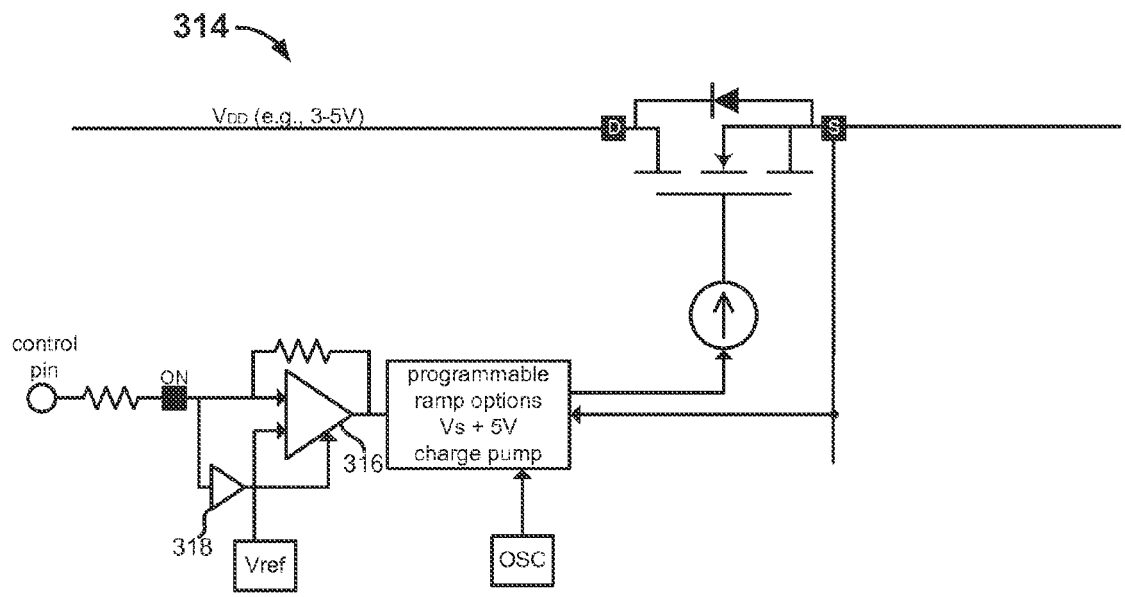
FIG. 3B illustrates a high level block diagram of an embodiment of a load switch.

FIG. 3B illustrates a high level block diagram of an embodiment of a load switch. In some embodiments, load switch 314 comprises a variation of load switch 300. In the examples of FIGS. 3A-3B, main amplifier 316 is used to set the ramp rate of the MOSFET. In order to minimize or at least reduce the power consumption of main amplifier 316, digital buffer 318 is introduced in the configuration of FIG. 3B. Low power digital buffer 318 (<1 uA) is added to save system power and always stays on. Digital buffer 318 goes high when a standard logic level such as 0.7V, 1.2V, etc., is applied to its input. Main amplifier 316 is not required or desired to be ON until after an external voltage applied to the ON pin rises to above the logic level of digital buffer 318, thus minimizing or at least reducing power consumption by main amplifier 316.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. An integrated circuit, comprising:
a MOSFET (Metal-Oxide-Semiconductor Field-Effect Transistor) configured as a switch; and
circuitry for providing an adjustable ramp rate for MOSFET turn-on, wherein a value of the ramp rate depends on a voltage level on an input pin of the integrated circuit;
wherein the integrated circuit comprises only four pins including the input pin, a drain pin, a source pin, and a ground pin.

2. The integrated circuit of claim 1, wherein the switch comprises a load switch.

3. The integrated circuit of claim 1, wherein the switch comprises a high-side load switch.

4. The integrated circuit of claim 1, wherein the ramp rate is linear and closed loop.

5. The integrated circuit of claim 1, wherein the value of the ramp rate is inversely proportional to the voltage level on the input pin.

6. The integrated circuit of claim 1, wherein the voltage level on the input pin is set by an external voltage divider.

7. The integrated circuit of claim 1, wherein the voltage level on the input pin comprises a discrete voltage level.

8. The integrated circuit of claim 1, wherein the circuitry for providing an adjustable ramp rate is configured to translate voltage input into the integrated circuit into a linear, closed loop ramp.

9. The integrated circuit of claim 1, wherein an adjustable discharge is provided via an external discharge resistor placed in series with the ground pin of the integrated circuit.

10. The integrated circuit of claim 1, wherein the circuitry for providing an adjustable ramp rate comprises a voltage controlled current source that feeds a capacitor.

11. The integrated circuit of claim 1, further comprising circuitry for over-temperature protection.

12. The integrated circuit of claim 1, further comprising circuitry for over-current protection.

13. The integrated circuit of claim 1, further comprising circuitry for short circuit protection.

14. A method, comprising:
configuring a MOSFET (Metal-Oxide-Semiconductor Field-Effect Transistor) as a switch; and
configuring circuitry for providing an adjustable ramp rate for MOSFET turn-on;
wherein the MOSFET and the circuitry form a four pin integrated circuit comprising an input pin, a drain pin, a source pin, and a ground pin and wherein a value of the ramp rate depends on a voltage level on the input pin of the integrated circuit.

15. The method of claim 14, wherein the ramp rate is linear and closed loop.

16. The method of claim 14, wherein the value of the ramp rate is inversely proportional to the voltage level on the input pin.

17. The method of claim 14, wherein the circuitry for providing an adjustable ramp rate comprises a voltage controlled current source that feeds a capacitor.

18. The method of claim 14, further comprising configuring circuitry for over-temperature protection.

19. The method of claim 14, further comprising configuring circuitry for over-current protection.

20. The method of claim 14, further comprising configuring circuitry for short circuit protection.

21. The integrated circuit of claim 1, wherein the voltage level on the input pin is driven from a DAC (digital-to-analog converter).

22. The integrated circuit of claim 1, wherein the voltage level on the input pin is driven from a PWM (pulse width modulator).

23. The method of claim 14, wherein the switch comprises a load switch.

24. The method of claim 14, wherein the switch comprises a high-side load switch.

25. The method of claim 14, wherein the voltage level on the input pin is set by an external voltage divider.

26. The method of claim 14, wherein the voltage level on the input pin comprises a discrete voltage level.

27. The method of claim 14, wherein the circuitry for providing an adjustable ramp rate is configured to translate voltage input into the integrated circuit into a linear, closed loop ramp.

28. The method of claim 14, further comprising placing an external discharge resistor in series with the ground pin of the integrated circuit to provide an adjustable discharge.

29. The method of claim 14, wherein the voltage level on the input pin is driven from a DAC (digital-to-analog converter).

30. The method of claim 14, wherein the voltage level on the input pin is driven from a PWM (pulse width modulator).

\* \* \* \* \*